(12) United States Patent
Katayama

(10) Patent No.: US 10,173,833 B2
(45) Date of Patent: Jan. 8, 2019

(54) GLASS SUBSTRATE PACKAGE

(71) Applicant: Nippon Electric Glass Co., Ltd., Shiga (JP)

(72) Inventor: Hiroki Katayama, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 15/558,591

(22) PCT Filed: Mar. 23, 2016

(86) PCT No.: PCT/JP2016/059216
§ 371 (c)(1),
(2) Date: Sep. 15, 2017

(87) PCT Pub. No.: WO2016/167092
PCT Pub. Date: Oct. 20, 2016

(65) Prior Publication Data
US 2018/0072489 A1    Mar. 15, 2018

(30) Foreign Application Priority Data
Apr. 17, 2015 (JP) ................................ 2015-085130

(51) Int. Cl.
| B65D 85/48 | (2006.01) |
| B65D 81/05 | (2006.01) |
| B65D 85/62 | (2006.01) |
| H01L 21/673 | (2006.01) |

(52) U.S. Cl.
CPC ........... *B65D 85/48* (2013.01); *B65D 81/051* (2013.01); *B65D 85/62* (2013.01); *H01L 21/67363* (2013.01); *H01L 21/67369* (2013.01)

(58) Field of Classification Search
CPC ....... B65D 81/051; B65D 85/48; B65D 85/62
USPC ........................................ 206/454, 455, 710
See application file for complete search history.

(56) References Cited

U.S. PATENT DOCUMENTS

| 5,238,876 A * | 8/1993 | Takeuchi ............. B28D 5/0011 |
| | | 156/229 |
| 2002/0144927 A1* | 10/2002 | Brooks ............. H01L 21/67356 |
| | | 206/710 |
| 2003/0010657 A1* | 1/2003 | Zabka ............... H01L 21/67353 |
| | | 206/303 |

(Continued)

FOREIGN PATENT DOCUMENTS

| CN | 2584527 | 11/2003 |
| CN | 1554561 | 12/2004 |

(Continued)

OTHER PUBLICATIONS

International Search Report dated Jun. 21, 2016 in International Application No. PCT/JP2016/059216.

(Continued)

*Primary Examiner* — Luan K Bui
(74) *Attorney, Agent, or Firm* — Wenderoth, Lind & Ponack, L.L.P.

(57) ABSTRACT

Provided is a glass substrate package (1), including a plurality of disc-shaped glass substrates (2) packaged in a box (3), in which the plurality of disc-shaped glass substrates (2) are stacked and packaged in a horizontal posture under a state in which slip sheets (4) are interposed between the plurality of disc-shaped glass substrates (2).

6 Claims, 4 Drawing Sheets

(56) References Cited

U.S. PATENT DOCUMENTS

| | | | | |
|---|---|---|---|---|
| 2004/0256284 A1* | 12/2004 | Nanjo | ............... | H01L 21/67309 |
| | | | | 206/710 |
| 2005/0011808 A1* | 1/2005 | Pylant | ............... | H01L 21/67346 |
| | | | | 206/710 |
| 2005/0011809 A1* | 1/2005 | Pylant | ............... | H01L 21/67369 |
| | | | | 206/710 |
| 2006/0237343 A1* | 10/2006 | Fuyumuro | ........ | H01L 21/67132 |
| | | | | 206/710 |
| 2007/0187286 A1* | 8/2007 | Pylant | ............... | H01L 21/67369 |
| | | | | 206/710 |
| 2009/0095650 A1* | 4/2009 | Pylant | ............... | H01L 21/67369 |
| | | | | 206/710 |
| 2009/0260329 A1* | 10/2009 | Ochoa | ............... | H01L 21/67369 |
| | | | | 53/473 |

FOREIGN PATENT DOCUMENTS

| | | |
|---|---|---|
| CN | 1935605 | 3/2007 |
| JP | 10-335429 | 12/1998 |
| JP | 2004-273867 | 9/2004 |
| JP | 2005-289436 | 10/2005 |
| JP | 2008-184186 | 8/2008 |
| JP | 2012-56582 | 3/2012 |

OTHER PUBLICATIONS

International Preliminary Report on Patentability dated Oct. 17, 2017 in International Application No. PCT/JP2016/059216.
Office Action dated Jun. 21, 2018 in corresponding Chinese patent application No. 201680005470.4, with English translation.

* cited by examiner

GLASS SUBSTRATE PACKAGE

TECHNICAL FIELD

The present invention: relates to a glass substrate package in which a plurality of glass substrates are packaged in a packaging material, and more specifically, to a package in which disc-shaped glass substrates are packaged.

BACKGROUND ART

In recent years, in a back grinding step of a semiconductor wafer, a disc-shaped glass substrate has been adopted as a support configured to support the semiconductor wafer in some cases. After being manufactured, a plurality of such disc-shaped glass substrates are packaged together to form a package and shipped from a manufacturing facility. Here, in Patent Literature 1, there is a disclosure of a package including a substrate accommodating container capable of accommodating a plurality of disc-shaped glass substrates in parallel to each other in a vertical posture.

In the package disclosed in Patent Literature 1, the substrate accommodating container includes an accommodating portion for accommodating the plurality of disc-shaped glass substrates in a vertical posture and a lid portion to be mounted on the accommodating portion, and in the accommodating portion, a plurality of holding guides for accommodating the plurality of disc-shaped glass substrates at predetermined intervals are formed. Further, in the lid portion, a plurality of hole portions for inserting the respective disc-shaped glass substrates into the accommodating portion are formed.

CITATION LIST

Patent Literature 1: JP 2012-56582 A

SUMMARY OF INVENTION

Technical Problem

The package disclosed in Patent Literature 1 has the following problems to be solved. That is, in this package, it is necessary that the numbers of the holding guides and hole portions to be formed in the substrate accommodating container (accommodating portion and lid portion) correspond to the number of the disc-shaped glass substrates to be accommodated. Therefore, as the number of the disc-shaped glass substrates to be accommodated is increased, the numbers of the holding guides and hole portions to be formed in the substrate accommodating container inevitably increase, to thereby increase the manufacturing cost of the substrate accommodating container. As a result, there is a drawback in that the cost required for packaging increases.

Further, in the above-mentioned package, the disc-shaped glass substrates are accommodated in the substrate accommodating container in a vertical posture. Therefore, in outer peripheral end portions of the disc-shaped glass substrates arranged in a vertical posture, a site positioned at a lower end is brought into point contact with the accommodating portion to receive an excessive stress locally. The outer peripheral end portion of the disc-shaped glass substrate is generally subjected to chamfering processing or the like with a grinding tool or the like. Therefore, in some cases, the disc-shaped glass substrate is broken from the outer peripheral end portion due to the action of a stress to a crack or the like occurring during the processing.

The present invention has been made in view of the above-mentioned circumstances, and a technical object of the present invention is to enable a plurality of disc-shaped glass substrates to be packaged at row cost while preventing the disc-shaped glass substrates from being broken.

Solution to Problem

A glass substrate package according to one embodiment of the present invention, which is devised to achieve the above-mentioned object, comprises a plurality of disc-shaped glass substrates packaged in a packaging material, wherein the plurality of disc-shaped glass substrates are stacked and packaged in a horizontal posture under a state in which protective sheets are interposed between the plurality of disc-shaped glass substrates.

With the above-mentioned configuration, the plurality of disc-shaped glass substrates can be packaged in the packaging material merely by stacking the plurality of disc-shaped glass substrates in a horizontal posture and interposing the protective sheets between those substrates. Therefore, the cost required for packaging the disc-shaped glass substrates can be reduced. In addition, the plurality of disc-shaped glass substrates are stacked in a horizontal posture, and hence an excessive stress can also be prevented from being applied to an outer peripheral portion of each of the disc-shaped glass substrates. As a result, the occurrence of such a situation that the disc-shaped glass substrate is broken from the outer peripheral end portion can be prevented accurately. As described above, in the glass substrate package according to the embodiment of the present invention, the plurality of disc-shaped glass substrates can be packaged at low cost while the disc-shaped glass substrates are prevented from being broken.

In the above-mentioned configuration, each of the plurality of disc-shaped glass substrates may comprise a positioning portion formed by partially removing an outer peripheral end portion thereof in order to position the disc-shaped glass substrate.

When the disc-shaped glass substrate comprises the positioning portion, the positioning portion is formed by partially removing the outer peripheral end portion of the disc-shaped glass substrate, and hence the strength of the disc-shaped glass substrate inevitably decreases, with the result that the disc-shaped glass substrate becomes liable to be broken. However, in the glass substrate package according to the embodiment of the present invention, as described above, each of the disc-shaped glass substrates can be accurately prevented from being broken because the plurality of disc-shaped glass substrates are stacked in a horizontal posture. Therefore, when the glass substrate package according to the embodiment of the present invention is adopted for packaging the disc-shaped glass substrate comprising the positioning portion, the usefulness thereof can be further enhanced.

In the above-mentioned configuration, it is preferred that the plurality of disc-shaped glass substrates be stacked under a state in which positions of the positioning portions are aligned with each other.

With this, the positions of the positioning portions of the plurality of disc-shaped glass substrates packaged are aligned with each other. Therefore, when the packaging material is unpacked, and each of the disc-shaped glass substrates is subjected to treatment, the treatment can be smoothly performed.

In the above-mentioned configuration, it is preferred that the packaging material comprise a side wall portion configured to surround the outer peripheral end portions of the plurality of disc-shaped glass substrates, and the plurality of disc-shaped glass substrates be packaged so that the positioning portions are free from being brought into contact with the side wall portion.

With this, the contact between the positioning portion of the disc-shaped glass substrate and the side wall portion of the packaging material can be accurately avoided. Therefore, the stress applied to the positioning portion can be suppressed to the extent possible, and the occurrence of such a situation that the disc-shaped glass substrate is broken from the positioning portion can be accurately prevented.

In the above-mentioned configuration, it is preferred that part of the outer peripheral end portion of each of the plurality of disc-shaped glass substrates be brought into contact with the side wall portion.

With this, the disc-shaped glass substrate is supported by the side wall portion of the packaging material. Therefore, for example, when the glass substrate package according to the embodiment of the present invention is transported, it becomes easy to prevent the occurrence of such a situation that, due to the vibration or the like occurring in the packaging material, each of the disc-shaped glass substrates moves in the packaging material, and the positional displacement occurs between the plurality of disc-shaped glass substrates.

In the above-mentioned configuration, it is preferred that when the plurality of disc-shaped glass substrates are seen in plan view, the side wall portion form a square circumscribing the plurality of disc-shaped glass substrates.

With this, the outer peripheral end portion of the disc-shaped glass substrate and the side wall portion of the packaging material are brought into contact with each other at four points under a state in which those four points are positioned at equal intervals along a circumferential direction of the disc-shaped glass substrate. With this, the disc-shaped glass substrate can be stably supported by the side wall portion of the packaging material. Thus, this configuration is more suitable for preventing the movement of each of the disc-shaped glass substrates in the packaging material and the positional displacement between the plurality of disc-shaped glass substrates when the glass substrate package according to the embodiment of the present invention is transported.

In the above-mentioned configuration, it is preferred that the packaging material comprise an upper wall portion opposed to the disc-shaped glass substrate positioned in an uppermost layer of the plurality of disc-shaped glass substrates, and the disc-shaped glass substrate positioned in the uppermost layer and the upper wall portion have a cushioning material filled therebetween.

With this, an impact caused by the vibration or the like can be easily prevented from propagating to the disc-shaped glass substrate when the glass substrate package according to the embodiment of the present invention is transported.

In the above-mentioned configuration, it is preferred that the packaging material comprise a box-shaped member, and the box-shaped member be formed in a developable manner.

With this, each of the disc-shaped glass substrates is easily accommodated in the box-shaped member by developing the box-shaped member, and each of the disc-shaped glass substrates is easily removed from the box-shaped member when the box-shaped member is unpacked.

In the above-mentioned configuration, it is preferred that each of the plurality of disc-shaped glass substrates have warpage, and the plurality of disc-shaped glass substrates be stacked under a state in which directions of the warpage are aligned with each other.

With this, when the packaging material is unpacked, the time and labor for inspecting the direction of warpage for each of the plurality of disc-shaped glass substrates can be saved.

In the above-mentioned configuration, it is preferred that each of the plurality of disc-shaped, glass substrates comprise a marking for determining the direction of the warpage.

With this, the direction of warpage of each of the disc-shaped glass substrates can be easily determined by observing the marking formed on the disc-shaped glass substrate.

Advantageous Effects of Invention

According to the present invention, the plurality of disc-shaped glass substrates can be packaged at low cost while the disc-shaped glass substrates are prevented from being broken.

DESCRIPTION OF EMBODIMENTS

Now, a glass substrate package according to an embodiment of the present invention is described with reference to the accompanying drawings. First, description is given of the configuration of the glass substrate package according to the embodiment of the present invention.

Figure 1:
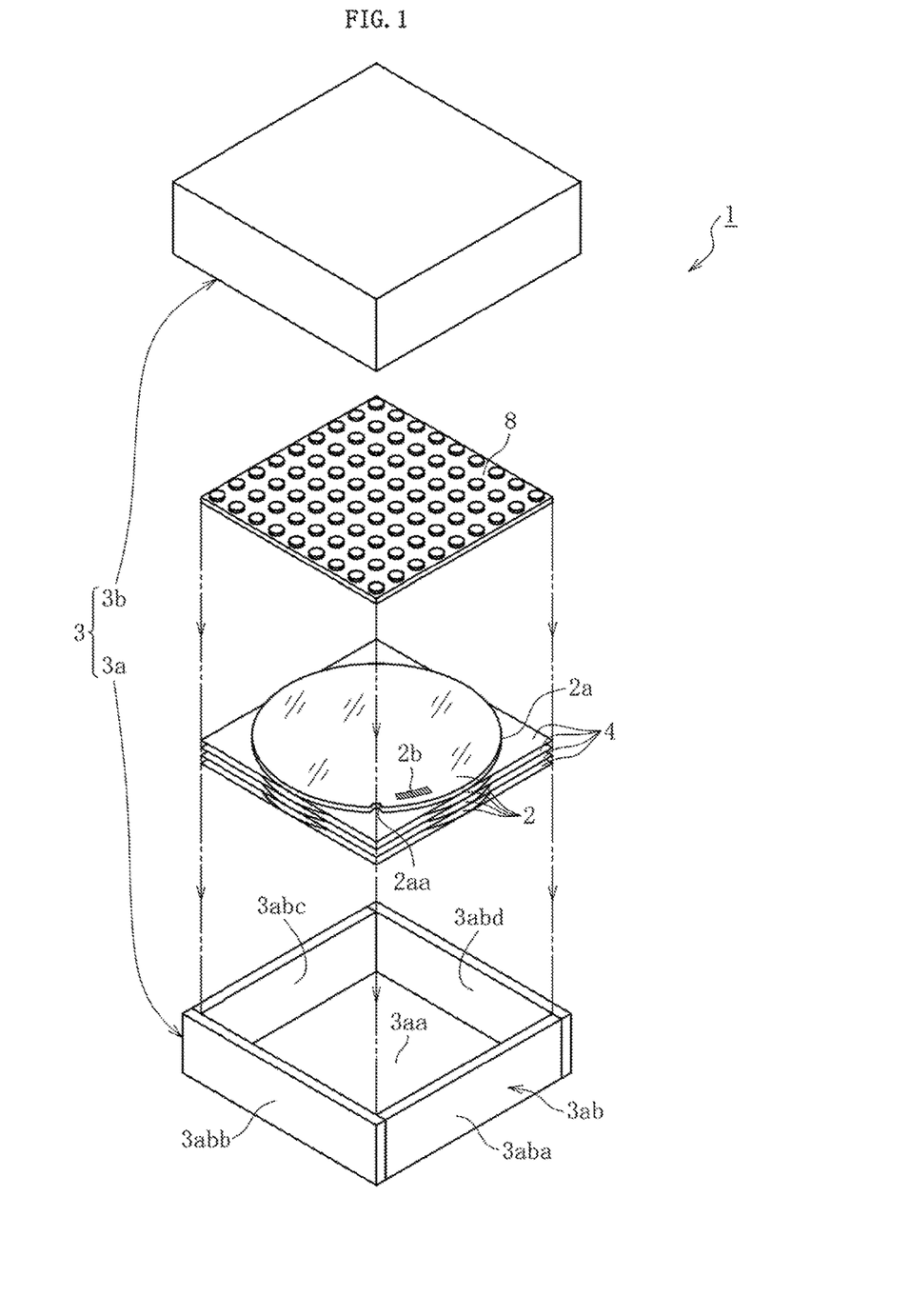
FIG. 1 is an exploded perspective view for illustrating a glass substrate package according to an embodiment of the present invention.
Figure 2:
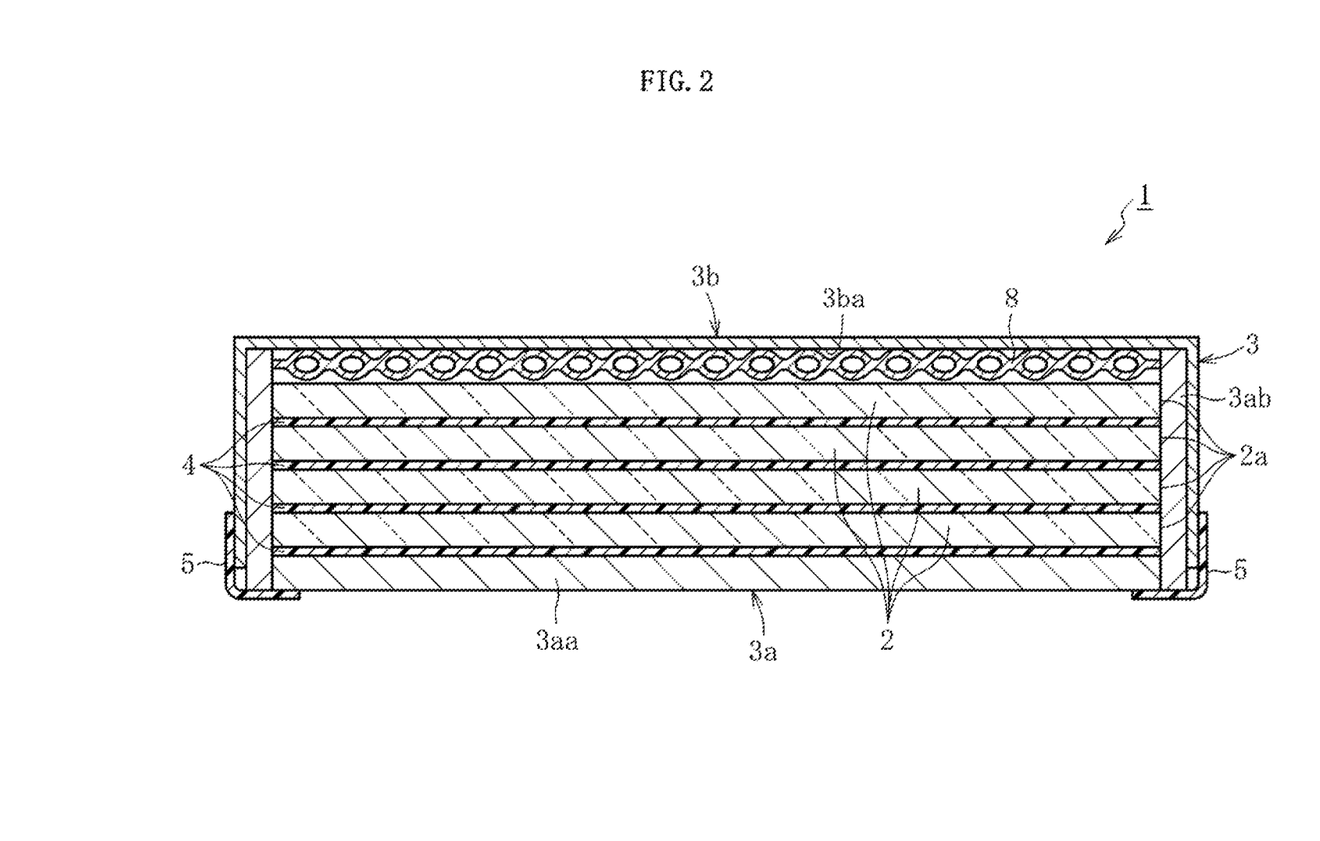
FIG. 2 is a vertical sectional side view for illustrating the glass substrate package according to the embodiment of the present invention.

As illustrated in FIG. 1 and FIG. 2, a glass substrate package 1 according to the embodiment of the present invention has a configuration in which a plurality of disc-shaped glass substrates 2 are packaged in a box 3 serving as a packaging material (box-shaped member). In the glass substrate package 1, the plurality of disc-shaped glass substrates 2 are stacked and packaged in a horizontal posture under a state in which slip sheets 4 serving as protective sheets are interposed between the plurality of disc-shaped glass substrates 2.

Each of the plurality of disc-shaped glass substrates 2 is a glass substrate serving as a support configured to support a semiconductor wafer in a back grinding step of the semiconductor wafer. In each of the disc-shaped glass substrates 2, a notch 2aa serving as a positioning portion, which is formed by partially removing an outer peripheral end portion 2a, is formed. The notch 2aa is formed in order to position the disc-shaped glass substrate 2 by determining the direction of the disc-shaped glass substrate 2 when the disc-shaped glass substrate 2 is seen in plan view. Further, each of the disc-shaped glass substrates 2 has warpage which is curved so that one of upper and lower surfaces becomes convex, and a marking 2*b* for determining the direction of the warpage based on the SEMI standard is formed in the vicinity of the notch 2*aa* in each of the disc-shaped glass substrates 2. The marking 2*b* is formed of, for example, a character string drawn with a large number of dots formed on the disc-shaped glass substrate 2 by laser irradiation. Then, the plurality of disc-shaped glass substrates 2 are stacked under a state in which the positions of the notches 2*aa*, and the directions of the warpage are aligned with each other. In this embodiment, the plurality of disc-shaped glass substrates 2 are stacked under a state in which the lower surface of the upper and lower surfaces of each of the disc-shaped glass substrates 2 becomes convex.

In this case, for example, an average thermal expansion coefficient of the disc-shaped glass substrate 2 within the temperature range of from 30° C. to 380° C. is preferably increased when the ratio of a semiconductor chip is small and the ratio of a sealing material is large in a semiconductor wafer supported by the disc-shaped glass substrate 2. Meanwhile, when the ratio of the semiconductor chip is large and the ratio of the sealing material is small in the semiconductor substrate, the average thermal expansion coefficient is preferably decreased.

When the average thermal expansion coefficient of the disc-shaped glass substrate 2 within the temperature range of from 30° C. to 380° C. needs to be regulated to $0 \times 10^{-7}/°$ C. or more and less, than $50 \times 10^{-7}/°$ C., it is preferred that the disc-shaped glass substrate 2 comprise as a glass composition, in terms of mass %, 55% to 75% of $SiO_2$, 15% to 30% of $Al_2O_3$, 0.1% to 6% of $Li_2O$, 0% to 8% of $Na_2O+K_2O$ (total content of $Na_2O$ and $K_2O$), and 0% to 10% of $MgO+CaO+SrO+BaO$ (total content of MgO, CaO, SrO, and BaO). Alternatively, it is also preferred that the disc-shaped glass substrate 2 comprise as a glass composition, in terms of mass %, 55% to 75% of $SiO_2$, 10% to 30% of $Al_2O_3$, 0% to 0.3% of $Li_2O+Na_2O+K_2O$ (total content of $Li_2O$, $Na_2O$, and $K_2O$), and 5% to 20% of $MgO+CaO+SrO+BaO$.

Further, when the average thermal expansion coefficient of the disc-shaped glass substrate 2 within the temperature range of from 30° C. to 380° C. needs to be regulated to $50 \times 10^{-7}/°$ C. or more and less than $70 \times 10^{-7}/°$ C., it is preferred that the disc-shaped glass substrate 2 comprise as a glass composition, in terms of mass %, 55% to 75% of $SiO_2$, 3% to 15% of $Al_2O_3$, 5% to 20% of $B_2O_3$, 0% to 5% of MgO, 0% to 10% of CaO, 0% to 5% of SrO, 0% to 5% of BaO, 0% to 5% of ZnO, 5% to 15% of $Na_2O$, and 0% to 10% of $K_2O$. It is more preferred that the disc-shaped glass substrate 2 comprise as a glass composition, in terms of mass %, 64% to 71% of $SiO_2$, 5% to 10% of $Al_2O_3$, 8% to 15% of $B_2O_3$, 0% to 5% of MgO, 0% to 6% of CaO, 0% to 3% of SrO, 0% to 3% of BaO, 0% to 3% of ZnO, 5% to 15% of $Na_2O$, and 0% to 5% of $K_2O$.

In addition, when the average thermal expansion coefficient of the disc-shaped glass substrate 2 within the temperature range of from 30° C. to 380° C. needs to be regulated to $70 \times 10^{-7}/°$ C. or more and $85 \times 10^{-7}/°$ C. or less, it is preferred that the disc-shaped glass substrate 2 comprise as a glass composition, in terms of mass %, 60% to 75% of $SiO_2$, 5% to 15% of $Al_2O_3$, 5% to 20% of $B_2O_3$, 0% to 5% of MgO, 0% to 10% of CaO, 0% to 5% of SrO, 0% to 5% of BaO, 0% to 5% of ZnO, 7% to 16% of $Na_2O$, and 0% to 8% of $K_2O$. It is more preferred that the disc-shaped glass substrate 2 comprise as a glass composition, in terms of mass %, 60% to 68% of $SiO_2$, 5% to 15% of $Al_2O_3$, 5% to 20% of $B_2O_3$, 0% to 5% of MgO, 0% to 10% of CaO, 0% to 3% of SrO, 0% to 3% of BaO, 0% to 3% of ZnO, 8% to 16% of $Na_2O$, and 0% to 3% of $K_2O$.

In addition, when the average thermal expansion coefficient of the disc-shaped glass substrate 2 within the temperature range of from 30° C. to 380° C. needs to be regulated to more than $85 \times 10^{-7}/°$ C. and $120 \times 10^{-7}/°$ C. or less, it is preferred that the disc-shaped glass substrate 2 comprise as a glass composition, in terms of mass %, 55% to 70% of $SiO_2$, 3% to 13% of $Al_2O_3$, 2% to 8% of $B_2O_3$, 0% to 5% of MgO, 0% to 10% of CaO, 0% to 5% of SrO, 0% to 5% of BaO, 0% to 5% of ZnO, 10% to 21% of $Na_2O$, and 0% to 5% of $K_2O$.

Further, when the average thermal expansion coefficient of the disc-shaped glass substrate 2 within the temperature range of from 30° C. to 380° C. needs to be regulated to more than $120 \times 10^{-7}/°$ C. and $165 \times 10^{-7}/°$ C. or less, it is preferred that the disc-shaped glass substrate 2 comprise as a glass composition, in terms of mass %, 53% to 65% of $SiO_2$, 3% to 13% of $Al_2O_3$, 0% to 5% of $B_2O_3$, 0.1% to 6% of MgO, 0% to 10% of CaO, 0% to 5% of SrO, 0% to 5% of BaO, 0% to 5% of ZnO, 20% to 40% of $Na_2O+K_2O$, 12% to 21% of $Na_2O$, and 7% to 21% of $K_2O$.

With the foregoing, the average thermal expansion coefficient of the disc-shaped glass substrate 2 is easily regulated within a desired range, and the devitrification resistance is enhanced. Therefore, the disc-shaped glass substrate 2 having a small variation in thickness is easily obtained.

The slip sheet 4 is formed of, for example, a pulp sheet or a polyethylene sheet. The slip sheet 4 is formed into a square shape, and the length of one side of the square is set to a length equal to the diameter or the disc-shaped glass substrate 2. With this, the slip sheet 4 is capable of covering an entire principal surface (upper surface and lower surface) of the disc-shaped glass substrate 2 to protect the principal surface from the occurrence of a scratch and the like. A corner portion (site corresponding to a corner of the square) of the slip sheet 4 projects from the outer peripheral end portion 2*a* of the disc-shaped glass substrate 2.

Here, in this embodiment, the slip sheet 4 is used as the protective sheet. However, the present invention is not limited thereto, and for example, a resin, sheet, a film, or the like may be used as the protective sheet. In addition, in this embodiment, the slip sheet 4 is formed into a square shape. However, the present invention is not limited thereto, and the slip sheet 4 formed into any shape may be used. Further, it is not always necessary that the slip sheet 4 project from the outer peripheral end portion 2*a* of the disc-shaped glass substrate 2. For example, the slip sheet 4 with a circular shape having the same area as that of the principal surface of the disc-shaped glass substrate 2 may be used so that an outer peripheral profile of the disc-shaped glass substrate 2 and an outer peripheral profile of the slip sheet 4 are superimposed on one another in plan view.

The box 3 comprises a box main body 3*a* configured to accommodate the plurality of disc-shaped glass substrates 2 and a lid member 3*b* configured to cover the box main body 3*a* from above. As materials for the box main body 3*a* and the lid member 3*b*, a resin, wood, paper, plastic, and the like may be used. Both the box main body 3*a* and the lid member 3*b* can be fixed to each other through intermediation of a pressure-sensitive adhesive tape 5.

Figure 3:
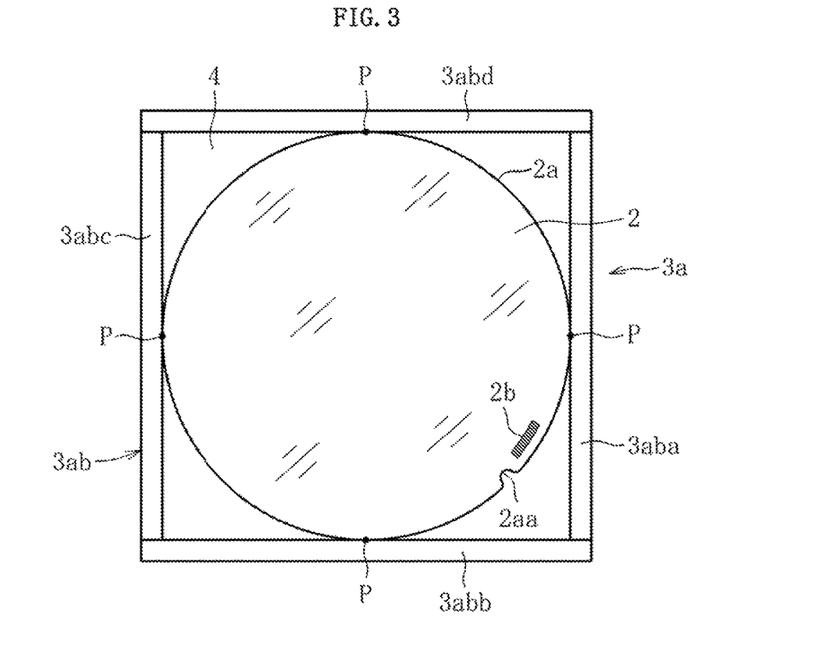
FIG. 3 is a plan view for illustrating the glass substrate package according to the embodiment of the present invention.

The box main body 3*a* comprises a bottom portion 3*aa* on which the plurality of disc-shaped glass substrates 2 are mounted, and a side wall portion 3*ab* which is connected to the bottom portion 3*aa* and is configured to surround the outer peripheral end portion 2*a* of each of the disc-shaped glass substrates 2. The bottom portion 3*aa* is formed into a square in plan view. Further, as illustrated in FIG. 3, the side wall portion 3ab forms a square circumscribing the disc-shaped glass substrate when the disc-shaped glass substrate 2 is seen in plan view. With this, part of the outer peripheral end portion 2a of each of the disc-shaped glass substrates 2 and the side wall portion 3ab are brought into contact with each other. Specifically, the outer peripheral end portion 2a of the disc-shaped glass substrate 2 and the side wall portion 3ab are brought into contact with each other at four points P, and the four points P are positioned at equal intervals along a circumferential direction of the disc-shaped glass substrate 2.

Further, each of the disc-shaped glass substrates 2 is accommodated (packaged) in the box main body 3a so that the notch 2aa of the substrate is free from being brought into contact with the side wall portion 3ab. More specifically, each of the disc-shaped glass substrates 2 is accommodated (packaged) in the box main body 3a so that each of the disc-shaped glass substrates 2 is arranged with the notch 2aa facing a corner of a square formed by the side wall portion 3ab.

Figure 4:
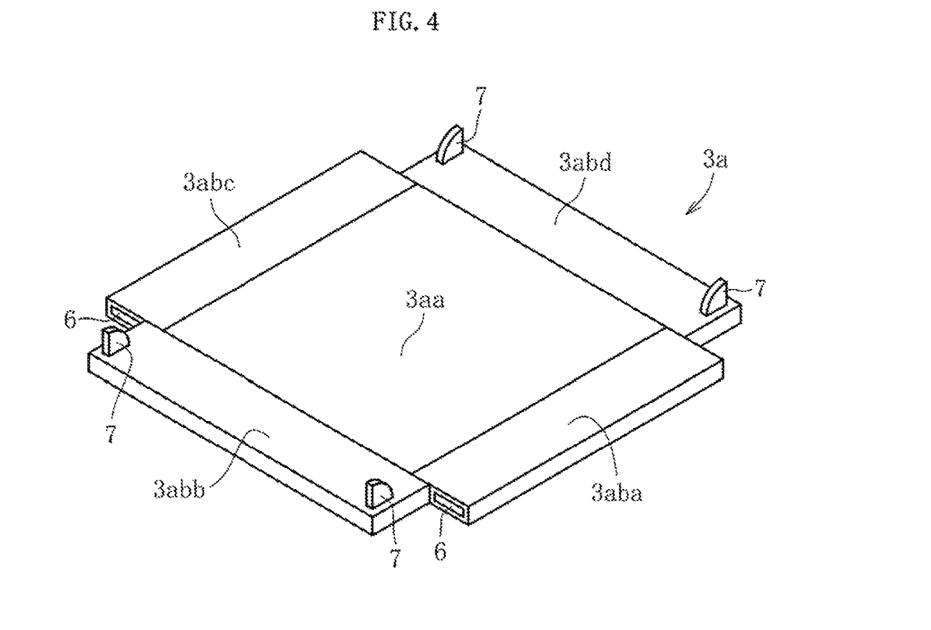
FIG. 4 is a perspective view for illustrating a box main body included in the glass substrate package according to the embodiment of the present invention.

The side wall portion 3ab of the box main body 3a comprises four wall portions 3aba to 3abd, and each of the wall portions 3aba to 3abd is capable of changing the posture thereof from a vertical posture illustrated in FIG. 1 to a horizontal posture illustrated in FIG. 4. With this, when each of the disc-shaped glass substrates 2 is accommodated in the box main body 3a and removed therefrom, the four wall portions 3aba to 3abd are put in a horizontal posture as illustrated in FIG. 4, and an accommodation operation and a removal operation can be performed under a state in which the box main body 3a is developed. Of the four wall portions 3aba to 3abd, the wall portions 3aba and 3abc each comprise holes 6 at both ends in a longitudinal direction thereof. Meanwhile, the wall portions 3abb and 3abd each comprise protrusions 7 at both ends in a longitudinal direction thereof. When each of the wall portions 3aba to 3abd is put in a vertical posture, and the protrusions 7 formed in the wall portions 3abb and 3abd are inserted into the holes 6 formed in the wall portions 3aba and 3abc, the box main body 3a in an assembled state illustrated in FIG. 1 can be obtained. In each of the four wall portions 3aba to 3abd, an inner wall surface opposed to the outer peripheral end portion 2a of the disc-shaped glass substrate 2 is formed of a cushioning material (for example, foamed polystyrene).

The lid member 3b comprises an upper wall portion 3ba opposed to the disc-shaped glass substrate 2 positioned in the uppermost layer of the plurality of disc-shaped glass substrates 2. As illustrated in FIG. 2, a bubble cushioning material 8 serving as a cushioning material is filled between the upper wall portion 3ba of the lid member 3b and the disc-shaped glass substrate 2 positioned in the uppermost layer. The cushioning material is not limited to the bubble cushioning material 8, and a resin, paper, foamed polystyrene, or the like may be used.

Here, in this embodiment, the box main body 3a and the lid member 3b are fixed to each other through intermediation of the pressure-sensitive adhesive tape 5. However, the present invention is not limited thereto. The box main body 3a and the lid member 3b may be fixed to each other, for example, by being tied with a string or by being wound with a rubber band. Further, in this embodiment, all the four wall portions 3aba to 3abd forming the side wall portion 3ab of the box main body 3a are capable of changing the posture thereof from a vertical posture to a horizontal posture. However, the present invention is not limited thereto. Only part of the four wall portions 3aba to 3abd may be capable of changing the posture thereof.

Now, the main action and effect in the case of using the glass substrate package 1 are described.

According to the glass substrate package 1, the plurality of disc-shaped glass substrates 2 can be packaged in the box 3 merely by stacking the plurality of disc-shaped glass substrates 2 in a horizontal posture and interposing the slip sheets 4 between the disc-shaped glass substrates 2. Therefore, the cost required for packaging the disc-shaped glass substrates 2 can be reduced. In addition, the plurality of disc-shaped glass substrates 2 are stacked in a horizontal posture, and hence the application of an excessive stress to the outer peripheral end portion 2a of each of the disc-shaped glass substrates 2 can also be avoided. As a result, the occurrence of such a situation that the disc-shaped glass substrate 2 is broken from the outer peripheral end portion 2a can be prevented accurately.

Here, the configuration of the glass substrate package according to the present invention is not limited to the configuration described in the above-mentioned embodiment. In the above-mentioned embodiment, the bottom portion of the box main body is formed into a square in plan view, but may be formed into a circle or a polygon. Similarly, in the above-mentioned embodiment, when the disc-shaped glass substrate is seen in plan view, the side wall portion forms a square circumscribing the disc-shaped glass substrate, but may form a circle or a polygon.

Further, in the glass substrate package according to the above-mentioned embodiment, a protective tape may be attached so as to cover the notch formed in each of the disc-shaped glass substrates in order to protect the notch. In this case, protective tapes may be individually attached to the notches of the plurality of disc-shaped glass substrates, or the notches of the plurality of disc-shaped glass substrates may be collectively covered with a single protective tape. When the notches are collectively covered with the single protective tape, it is preferred that, as the slip sheets to be interposed between the plurality of disc-shaped glass substrates, circular slip sheets each having the same area as that of the principal surface of the disc-shaped glass substrate be used.

Figure 5:
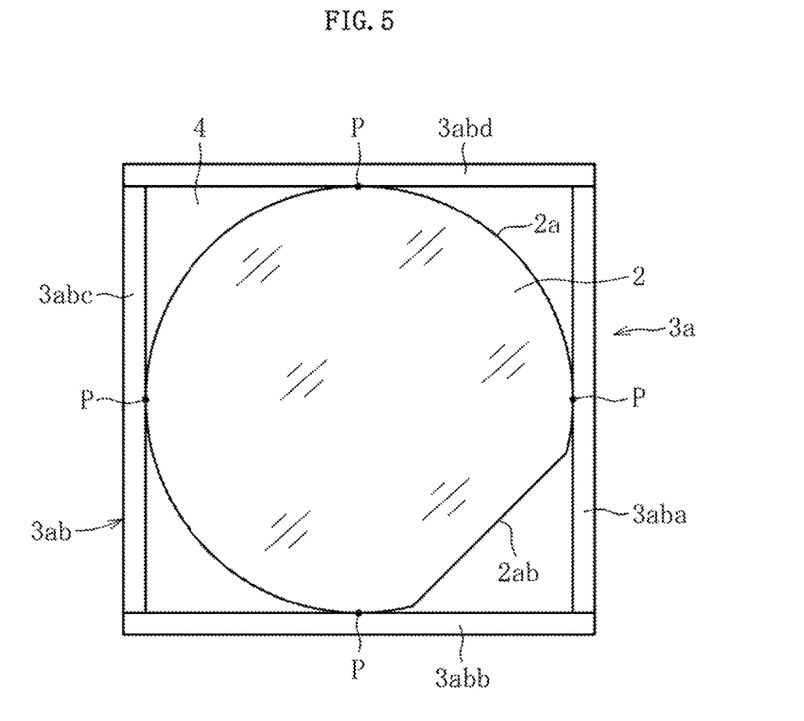
FIG. 5 is a plan view for illustrating a glass substrate package according to another embodiment of the present invention.

Further, in the above-mentioned embodiment, the configuration in which the disc-shaped glass substrate comprising the notch as the positioning portion is packaged is adopted, but the present invention is not limited thereto. As illustrated in FIG. 5, there may be adopted a configuration in which the disc-shaped glass substrate 2 comprising an orientation flat 2ab serving as the positioning portion is packaged. In this case, it is preferred that the disc-shaped glass substrate 2 be accommodated (packaged) in the box main body 3a so that the orientation flat 2ab in the substrate is free from being brought into contact with the side wall portion 3ab. In addition, in the above-mentioned embodiment, the box is used as the packaging material for packaging the plurality of disc-shaped glass substrates, but the present invention is not limited thereto. A bag, wrapping paper, or the like may be used as the packaging material.

REFERENCE SIGNS LIST 1 glass substrate package
2 disc-shaped glass substrate
2a outer peripheral end portion
2aa notch
2ab orientation flat
2b marking 3 box
3a box main body
3aa bottom portion
3ab side wall portion
3aba wall portion
3abb wall portion
3abc wall portion
3abd wall portion
4 slip sheet
5 pressure-sensitive adhesive tape
6 hole
7 protrusion
8 bubble cushioning material
P point

The invention claimed is:

1. A glass substrate package, comprising a plurality of disc-shaped glass substrates packaged in a packaging material,
wherein the plurality of disc-shaped glass substrates are stacked and packaged in a horizontal posture under a state in which protective sheets are interposed between the plurality of disc-shaped glass substrates,
wherein each of the plurality of disc-shaped glass substrates comprises a positioning portion formed by partially removing an outer peripheral end portion thereof in order to position the disc-shaped glass substrates,
wherein the packaging material comprises a side wall portion configured to surround the outer peripheral end portions of the plurality of disc-shaped glass substrates,
wherein the plurality of disc-shaped glass substrates are packaged so that the positioning portions are free from being brought into contact with the side wall portion, and
wherein part of the outer peripheral end portion of each of the plurality of disc-shaped glass substrates is brought into contact with the side wall portion.

2. The glass substrate package according to claim 1, wherein the plurality of disc-shaped glass substrates are stacked under a state in which positions of the positioning portions are aligned with each other.

3. The glass substrate package according to claim 1,
wherein the packaging material comprises an upper wall portion opposed to the disc-shaped glass substrate positioned in an uppermost layer of the plurality of disc-shaped glass substrates, and
wherein the disc-shaped glass substrate positioned in the uppermost layer and the upper wall portion have a cushioning material filled therebetween.

4. The glass substrate package according to claim 1, wherein the packaging material comprises a box-shaped member, and the box-shaped member is formed in a developable manner.

5. The glass substrate package according to claim 1, wherein the positioning portion is a notch or an orientation flat.

6. A glass substrate package, comprising a plurality of disc-shaped glass substrates packaged in a packaging material,
wherein the plurality of disc-shaped glass substrates are stacked and packaged in a horizontal posture under a state in which protective sheets are interposed between the plurality of disc-shaped glass substrates,
wherein each of the plurality of disc-shaped glass substrates comprises a positioning portion formed by partially removing an outer peripheral end portion thereof in order to position the disc-shaped glass substrates,
wherein the packaging material comprises a side wall portion configured to surround the outer peripheral end portions of the plurality of disc-shaped glass substrates,
wherein the plurality of disc-shaped glass substrates are packaged so that the positioning portions are free from being brought into contact with the side wall portion,
wherein part of the outer peripheral end portion of each of the plurality of disc-shaped glass substrates is brought into contact with the side wall portion, and
wherein, when the plurality of disc-shaped glass substrates are seen in plan view, the side wall portion forms a square circumscribing the plurality of disc-shaped glass substrates.

* * * * *